US006815230B2

United States Patent
Park et al.

(10) Patent No.: US 6,815,230 B2
(45) Date of Patent: Nov. 9, 2004

(54) CONTROL SIGNAL TRANSMITTING METHOD WITH PACKAGE POWER PIN AND RELATED INTEGRATED CIRCUIT PACKAGE STRUCTURE

(75) Inventors: Yong-Dae Park, Yongin (KR); Uk-Rae Cho, Suwon (KR)

(73) Assignee: Samsung Electronics Co., Ltd. (KR)

( * ) Notice: Subject to any disclaimer, the term of this patent is extended or adjusted under 35 U.S.C. 154(b) by 68 days.

(21) Appl. No.: 10/034,320

(22) Filed: Dec. 28, 2001

(65) Prior Publication Data

US 2002/0192846 A1 Dec. 19, 2002

(30) Foreign Application Priority Data

Jun. 13, 2001 (KR) ......................................... 2001-33086

(51) Int. Cl.[7] ........................ G01R 31/26; H01L 21/66
(52) U.S. Cl. ........................... 438/14; 438/11; 438/15; 438/25; 438/106; 257/48; 257/678; 716/4
(58) Field of Search .............................. 438/11, 14–15, 438/25–26, 51, 64, 106, 478, 238–39, 239; 257/355, 678, 778–780, 48; 716/4–6

(56) References Cited

U.S. PATENT DOCUMENTS

| | | | | | |
|---|---|---|---|---|---|
| 5,043,943 | A | * | 8/1991 | Crisp et al. | 365/189.01 |
| 5,051,615 | A | * | 9/1991 | Rosenthal | 307/350 |
| 5,412,333 | A | * | 5/1995 | Okunaga | 327/198 |
| 5,568,610 | A | * | 10/1996 | Brown | 395/185.01 |
| 5,767,583 | A | * | 6/1998 | Lee et al. | 257/786 |
| 5,768,173 | A | * | 6/1998 | Seo et al. | 365/52 |
| 5,880,596 | A | * | 3/1999 | White | 326/38 |
| 5,920,227 | A | * | 7/1999 | An | 327/544 |
| 5,946,257 | A | * | 8/1999 | Keeth | 365/226 |
| 6,034,539 | A | * | 3/2000 | Hwang | 326/38 |
| 6,355,980 | B1 | * | 3/2002 | Callahan | 257/734 |
| 6,366,487 | B1 | * | 4/2002 | Yeom | 365/52 |
| 6,426,560 | B1 | * | 7/2002 | Kawamura et al. | 257/777 |
| 6,427,222 | B1 | * | 7/2002 | Shau | 716/4 |
| 6,515,505 | B1 | * | 2/2003 | Rees | 326/38 |
| 6,545,497 | B2 | * | 4/2003 | Hebert et al. | 324/765 |
| 6,551,846 | B1 | * | 4/2003 | Furutani et al. | 438/17 |
| 6,615,289 | B1 | * | 9/2003 | Feurle et al. | 710/14 |
| 2001/0026022 | A1 | * | 10/2001 | Schoenfeld | 257/784 |
| 2002/0009006 | A1 | * | 1/2002 | Saitoh et al. | 365/201 |

FOREIGN PATENT DOCUMENTS

| | | | | |
|---|---|---|---|---|
| JP | 9-185898 | * | 7/1997 | G11C/29/00 |
| JP | 2000-11641 | * | 1/2000 | G11C/11/401 |
| JP | 2000-150564 | * | 5/2000 | |

* cited by examiner

*Primary Examiner*—Matthew Smith
*Assistant Examiner*—Granvill D. Lee, Jr.
(74) *Attorney, Agent, or Firm*—F. Chau & Associates, LLC

(57) ABSTRACT

A method and a device are disclosed for transmitting a control signal to an option pad of an integrated circuit chip at its package level. The method includes the steps of: electrically isolating one of a plurality of commonly connected power transmitting pins of the integrated circuit package; connecting the electrically isolated power transmitting pin to the option pad to thereby transmit a control signal from outside through the electrically isolated power transmitting pin to the option pad.

22 Claims, 3 Drawing Sheets

FIG. 1 [Prior Art]

CONTROL SIGNAL TRANSMITTING METHOD WITH PACKAGE POWER PIN AND RELATED INTEGRATED CIRCUIT PACKAGE STRUCTURE

BACKGROUND OF THE INVENTION

1. Field of the Invention

The present invention relates to a structure of a semiconductor integrated circuit package and, more particularly, to a control signal transmitting method and the related structure of an integrated circuit package.

2. Description of the Related Art

In fabricating a semiconductor integrated circuit such as a random access memory, one or more additional I/O pad is typically used for providing testing, diagnostic or other control functions. For instance, the additional pad can be used as a pad to communicate test signals such as for a wafer burn-in test, where temperature and voltage stress are applied to a plurality of memory cells selected at the wafer level to screen initial failures. Other tests may include a merged-DQ test to simultaneously test a plurality of inputs/outputs, and parallel BIT test to simultaneously test a plurality of memory cells. Testing performed at the early stage of semiconductor manufacture increases reliability and thus the yield efficiency of the semiconductor device.

In the case where tests are performed with the additional or option pad at the wafer level where integrated circuit chips are included on the wafer, there have been limitations of the tests because the option pad cannot be accessed at the package level. As the specification sizes and pin outs of packages are standardized, an extra pin or an option pin cannot be easily provided. In other words, it is very difficult to randomly provide an option pin to be connected with the option pad while the structure of package pins is particularly specified. Thus, various tests are not effectively performed at the package level, thereby lowering productivity yield.

To provide more thorough understanding of the above problems, a description will be made with reference to the accompanying drawings.

Referring to FIG. 1, a general integrated circuit package is constructed in an integrated circuit chip 10 with a receiving unit 12 as an internal circuit, a wafer pad unit 13, and a package pin unit 21 as an integrated circuit package by mounting and packaging the integrated circuit chip 10 at a lead frame. The receiving unit 12 includes a control receiver 1, an option receiver 2 and a power (VSS/VDD) line 3. The wafer pad unit 13 includes a control pad and electrostatic discharge (ESD) circuit 4, an option pad 5, and a plurality of power pads 6 and 7. The package pin unit 21 includes a control pin 22 and power pins 23 and 24 connected to the corresponding plurality of power pads 6 and 7.

In the structure shown in the FIG. 1, the option pad 5 is exposed outside at the wafer level, so that a predetermined control signal can be provided through the option pad 5 to the option receiver 2 to perform desired tests. However, it is impossible to perform desired tests after completion of all packaging because a package pin is not available for connection with the option pad 5. Thus, to perform a test with the option pad, it is necessary to provide an additional package pin on the package. However, it is very difficult to additionally provide an option pin to be connected with the option pad because a specification of package assembly type is standardized.

SUMMARY OF THE INVENTION

A method for transmitting a control signal to an option pad of an integrated circuit chip at its package level is provided, which includes the steps of: electrically isolating one of a plurality of commonly connected power transmitting pins of the integrated circuit package; connecting the electrically isolated power transmitting pin to the option pad to thereby transmit a control signal from outside through the electrically isolated power transmitting pin to the option pad.

According to an embodiment of the present invention, the commonly connected power transmitting pins is connected to ground or a power supply. The option pad is a pad for performing a burn-in test at the package level. The control signal is an external signal to perform one of burn-in test, input/output test, and parallel bit test.

According to an embodiment of the present invention, the integrated circuit package includes a ball grid array pin arrangement, and includes a static random access memory device.

An integrated circuit package having an integrated circuit chip for transmitting a test control signal from outside is also provided, which includes: the integrated circuit chip being mounted in the integrated circuit package with power pads connected with an option pad and power lines connected to an internal circuit; power transmitting group pins connected to the power pads of a plurality of power transmitting pins assigned and formed at the integrated circuit package; and at least one signal transmitting pin connected to the option pad but electrically isolated from the power transmitting group pins.

According to an embodiment of the present invention, the power pads are ground voltage pads when the power transmitting pins are ground voltage pins, and the power pads are power supply voltage pads when the power transmitting group pins are supply power voltage pins. The option pad is a pad for performing a burn-in test at the package level. The control signal is an external signal to perform one of burn-in test, input/output test, and parallel bit test.

According to an embodiment of the present invention, the integrated circuit package includes a ball grid array pin arrangement and a static random access memory device. The option pad includes an electric static discharge circuit, and includes a keeper circuit to prevent a false operation of a device when the signal transmitting pin is open. The internal circuit is constructed with an option receiver having an inverter structure.

A method for performing a test by controlling an internal circuit of a package chip at the package level is also provides, which includes the steps of: connecting a power transmitting pin to an option pad, the option pad being accessible only at the wafer level; isolating the power transmitting pin from a plurality of power transmitting pins commonly connected to one of power and ground; and transmitting a test control signal to the option pad through the power transmitting pin.

BRIEF DESCRIPTION OF THE DRAWINGS

The above and other objects and advantages of the present invention will become more apparent by describing in detail preferred embodiments thereof with reference to the accompanying drawings in which.

DETAILED DESCRIPTION OF PREFERRED EMBODIMENTS

Hereinafter, a preferred embodiment of the present invention will be described in detail with reference to accompanying drawings. However, the embodiments of the present invention may be modified into various other forms, and the scope of the present invention must not be interpreted as being restricted to the embodiments. The embodiments are provided to more completely explain the present invention to those skilled in the art. Like numbers refer to like elements throughout and signal lines and signals thereon may be referred to by the same reference symbols.

Figure 1:
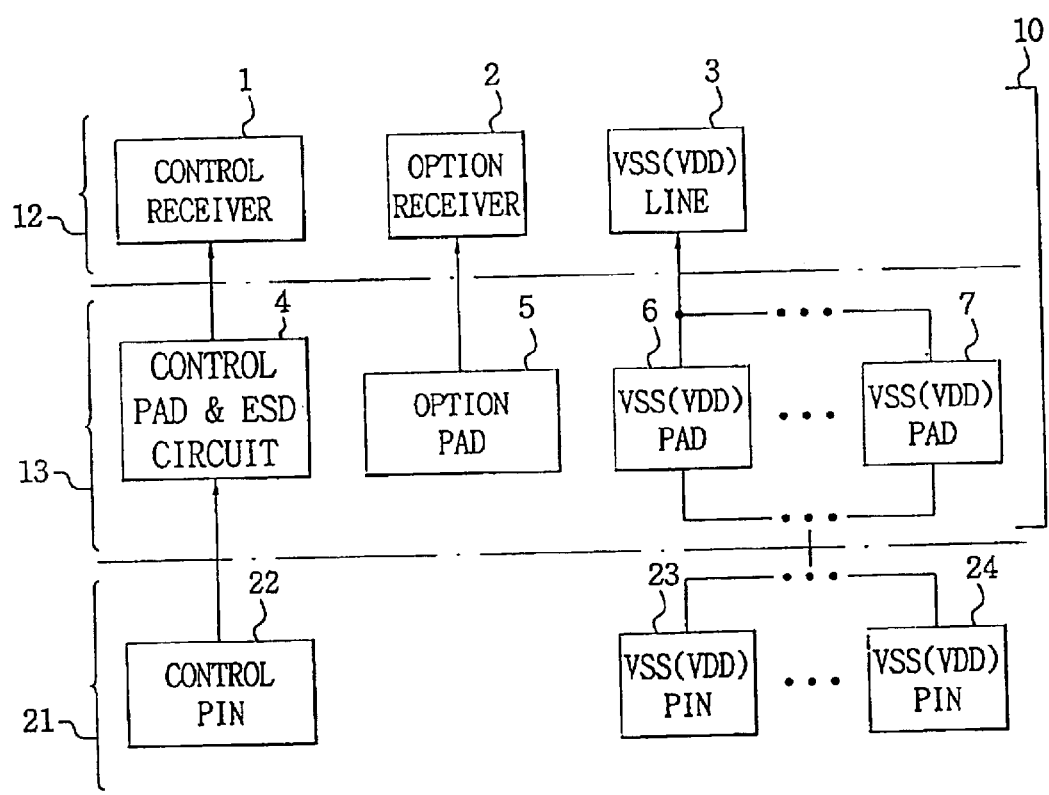
FIG. 1 is a block diagram of a conventional integrated circuit package.
Figure 2:
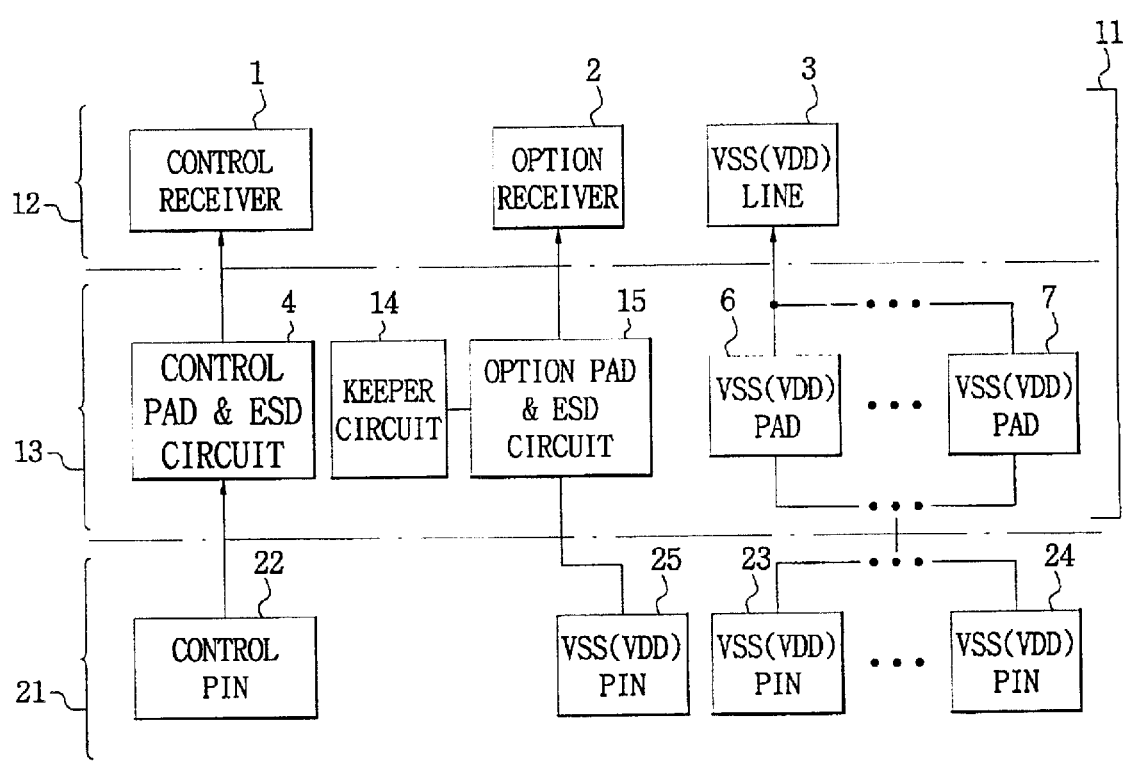
FIG. 2 is a block diagram of an integrated circuit package in accordance with the present invention.

FIG. 2 is a block diagram of an integrated circuit package according to a preferred embodiment of the present invention. The structure is constructed with an integrated circuit chip 11 having a receiving unit 12 as an internal circuit and a wafer pad unit 13, and a package pin unit 21 as an integrated circuit package for mounting and packaging the integrated circuit chip 11 at a printed circuit board (not shown). The receiving unit 12 includes control receiver 1, option receiver 2, and power (VSS/VDD) line 3. The wafer pad unit 13 includes a control pad and electrostatic discharge (ESD) circuit 4, an option pad 15, a keeper circuit 14 connected to the option pad 15, and a plurality of power pads 6 and 7. The package pin unit 21 includes a control pin 22, and power pins 23 and 24 connected to the corresponding plurality of power pads 6 and 7.

In accordance with an embodiment of the present invention as shown in FIG. 2, an additional power pin 25 connected to the option pad 15 is separated from the plurality of power pins 23 and 24 assigned as package pins, for instance, from VDD or VSS pins, to perform a vendor option control for tests at the package level. At this time, even if the additional power pin 25 is assigned as a power pin, it is independently connected to the option pad 15 to be used for transmitting a testing control signal according to an embodiment of the present invention.

In other words, the structure shown in FIG. 2 is constructed with at least one of the plurality of power pins 23, 24, and 25 assigned at the integrated circuit package to be independently connected with the option pad 15, the power pins have been electrically isolated or disconnected from the power pads 6 and 7. A control signal is transmitted to the option pad 15 of the integrated circuit chip 11 through at least one of the plurality of power pins 23, 24, and 25. The integrated circuit package may have a ball grid array pin arrangement.

According to a preferred embodiment of the present invention, a keeper circuit 14 is connected to the option pad 15 to prevent any false operations of a device when the additional power pin 25 is open. The keeper circuit 14 acts on keeping the low (or high) level of voltage of the option pad 15 when the option pad 15 floats. At this time, it is important to make an output of the keeper circuit 14 and a voltage level of the additional power pin 25 at a substantially same level. In other words, if the option pad 15 is connected to a ground power pin, the keeper circuit 14 should have a low level of an output.

According to an embodiment of the present invention, the option pad 15 further includes an ESD circuit which performs ESD function.

Figure 3:
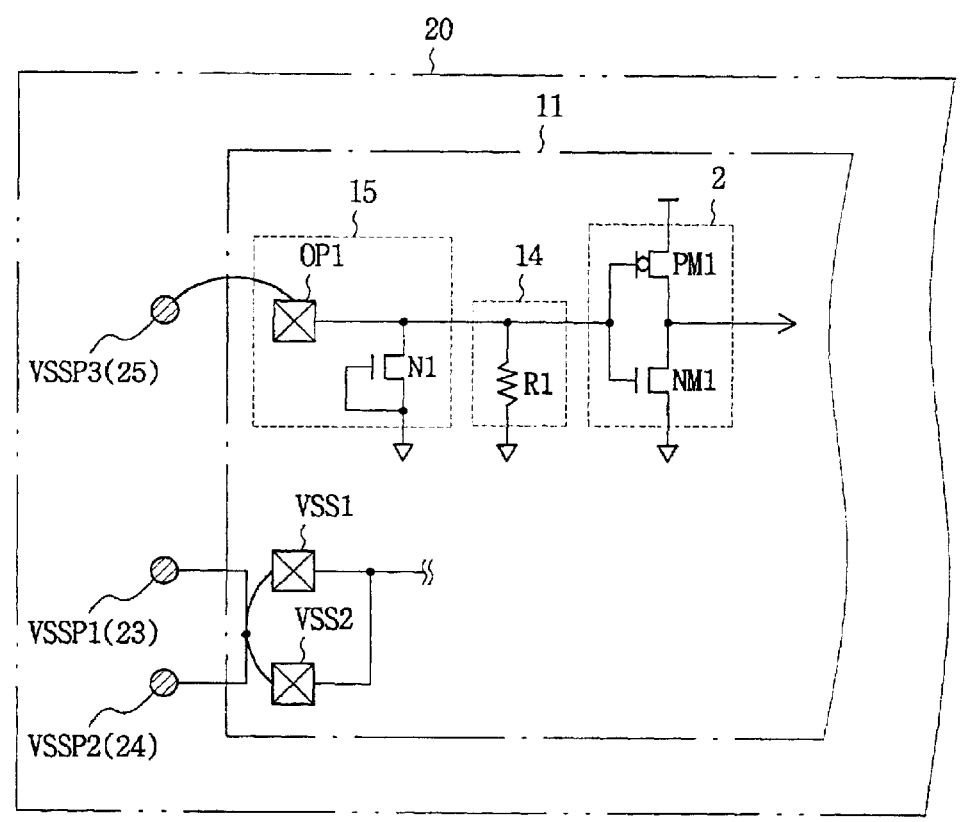
FIG. 3 is a circuit for illustrating the connection structure of power pins shown in FIG. 2.

FIG. 3 is a circuit for illustrating the related connection block of the plurality of power pins 23, 24, and 25 shown in FIG. 2. As shown in FIG. 3, an integrated circuit pad includes the integrated circuit chip 11 and the plurality of power pins 23, 24, and 25. The power pins 23 and 24 for transmitting power are connected to the power pads 6 and 7, and at least one power pin (here, 25) for transmitting a signal is independently connected to the option pad. As shown in FIG. 3, the power pins 23 and 24 are ground voltage pins VSSP1 and VSSP2 and connected with the ground pads VSS1 and VSS2, respectively, through a printed circuit board. Also, the power pin 25 is ground voltage pin VSSP3 and connected to the option pad OP1. An N type MOS transistor N1 is connected between the option pad OP1 and ground for functioning as an ESD circuit. Besides, a resistor R1 is connected between the option pad OP1 and ground for functioning as the keeper circuit 14. A CMOS inverter 2 having an input terminal is connected to the keeper circuit 14 as an input receiver circuit.

According to an embodiment of the present invention having the aforementioned pin connection structure, a description will be made for a method for performing a test by transmitting an outside testing control signal through the power pin 25.

A device having M×N packages in total, M packages in the column direction and N packages in the row direction, is inserted into a single board. A high level of a testing control signal is transmitted through the power pin 25 for a burn-in test.

For instance, in comparison of the pin configuration between 16M DDR SRAM and 32M DDR SRAM, a /G pin of the 16M DDR SRAM is replaced with an address pin for the 32M DDR SRAM, thereby not having the /G pin in the 32M DDR SRAM. Thus, a /G receiver is connected with a /G pad in the 16M DDR SRAM. On the other hand, to make use of the /G pin for a test in the 32M DDR SRAM, 32M address receiver is connected to the /G pad, and the /G receiver is connected to the power pad. A level maintaining keeper circuit is installed at the /G receiver to prevent a false operation with the power pad from pin floating, thereby making it possible to use the /G pin.

In the embodiment of the present invention, a testing control signal can be transmitted to the option pad at the package level without provision of an additional pin, thereby making a smooth pin management and improving productivity by efficiently performing various desired tests at the package level.

Having described a specific preferred embodiment of the invention with reference to the accompanying drawings, it is to be understood that the invention is not limited to the precise embodiment, and that various changes and modifications may be effected therein by one skilled in the art without departing from the scope or spirit of the invention as defined in the appended claims.

What is claimed is:

1. A method for transmitting a control signal to an option pad of an integrated circuit chip at its package level comprising the steps of:

electrically isolating one of a plurality of commonly connected power transmitting pins of the integrated circuit package;

connecting the electrically isolated power transmitting pin to the option pad to thereby transmit a control signal from outside through the electrically isolated power transmitting pin to the option pad.

2. The method, as defined in claim 1, wherein the commonly connected power transmitting pins is connected to ground.

3. The method, as defined in claim 1, wherein the commonly connected power transmitting pins is connected to a power supply.

4. The method, as defined in claim 1, wherein the option pad is a pad for performing a burn-in test at the package level.

5. The method, as defined in claim 1, wherein the control signal is an external signal to perform a burn-in test at the package level.

6. The method, as defined in claim 1, wherein the control signal is an external signal to perform one of burn-in test, input/output test, and parallel bit test.

7. The method, as defined in claim 1, wherein the integrated circuit package includes a ball grid array pin arrangement.

8. The method, as defined in claim 1, wherein the integrated circuit chip includes a static random access memory device.

9. An integrated circuit package having an integrated circuit chip, comprising:
   the integrated circuit chip being mounted in the integrated circuit package comprising an option pad and a plurality of power pads connected with power lines connected to an internal circuit;
   a plurality of power transmitting pins formed at the IC package level, where at least one of the power transmitting pins is electrically isolated from the other power transmitting pins and connected to the option pad to transmit a test control signal to the option pad.

10. The structure, as defined in claim 9, wherein the power pads are ground voltage pads when the power transmitting pins are ground voltage pins.

11. The structure, as defined in claim 9, wherein the power pads are power supply voltage pads when the power transmitting pins are supply power voltage pins.

12. The structure, as defined in claim 9, wherein the option pad is a pad for performing a burn-in test at the package level.

13. The structure, as defined in claim 9, wherein the control signal is an external signal to perform a burn-in test at the package level.

14. The structure, as defined in claim 9, wherein the control signal is an external signal to perform one of burn-in test, input/output test, and parallel bit test.

15. The structure, as defined in claim 9, wherein the integrated circuit package includes a ball grid array pin arrangement.

16. The structure, as defined in claim 9, wherein the integrated circuit chip includes a static random access memory device.

17. The structure, as defined in claim 9, wherein the option pad includes an electric static discharge circuit.

18. The structure, as defined in claim 9, wherein the option pad includes a keeper circuit to prevent a false operation of a device when the signal transmitting pin is open.

19. The structure, as defined in claim 9, wherein the internal circuit is constructed with an option receiver having an inverter structure.

20. A method for performing a test by controlling an internal circuit of a package chip at the package level, comprising the steps of:
   connecting a power transmitting pin to an option pad, the option pad being accessible only at the wafer level;
   isolating the power transmitting pin from a plurality of power transmitting pins commonly connected to one of power and ground; and
   transmitting a test control signal to the option pad through the power transmitting pin.

21. The method, as defined in claim 1, further comprising the step of preventing a false operation of a device when the electrically isolated power transmitting pin is open.

22. The method, as defined in claim 20, further comprising the step of preventing a false operation of a device when the electrically isolated power transmitting pin is open.

* * * * *